United States Patent [19]

Rinderer

[11] Patent Number: 5,284,254
[45] Date of Patent: Feb. 8, 1994

[54] RACK FOR ELECTRICAL EQUIPMENT

[75] Inventor: Eric R. Rinderer, Highland, Ill.

[73] Assignee: B-Line Systems, Inc., Highland, Ill.

[21] Appl. No.: 903,357

[22] Filed: Jun. 24, 1992

[51] Int. Cl.$^5$ ............................................. A47F 7/00
[52] U.S. Cl. .................................... 211/26; 361/809; 361/810
[58] Field of Search ....................... 211/26, 189, 190; 361/380, 417, 419, 420, 429

[56] References Cited

U.S. PATENT DOCUMENTS

| | | | |
|---|---|---|---|
| 2,959,715 | 11/1960 | Leonchick | 361/429 |
| 3,160,280 | 12/1964 | Burch | 211/26 |
| 3,420,381 | 1/1969 | Bradfield | 211/26 |
| 4,662,524 | 5/1987 | Fullenkamp et al. | 211/26 |
| 4,899,892 | 2/1990 | Rheault | 211/26 |
| 4,968,020 | 10/1991 | Savage et al. | 211/190 |
| 4,991,061 | 2/1991 | Strange | 361/419 |

OTHER PUBLICATIONS

Unequal Flange Rack, Mar. 11, 1975, ITT Telecommunications, (author unknown).
Cable-Duct Relay Rack, Dec. 8, 1982, Rockwell International Corp. (author unknown).

Primary Examiner—Paula A. Bradley
Assistant Examiner—Erik R. Puknys
Attorney, Agent, or Firm—Senniger, Powers, Leavitt & Roedel

[57] ABSTRACT

A rack for electrical equipment includes a base having a bottom wall, and a back wall extending up from the bottom wall at the back of the rack. The bottom wall has a plurality of fastener openings therein through which fasteners may be driven into a surface supporting the rack for securing the rack to the surface. A pair of legs extend up from the bottom wall of the base at opposite sides of the base adjacent the back wall of the base. A cover may be removably fastened to the base of the rack in a position where the cover extends forward from the back wall of the base between the legs of the rack and is spaced above the bottom wall of the base to form, in combination with the back and bottom walls of the base, an enclosure for electrical wiring and the like. Removal of the cover from the base provides ready access to the electrical wiring and the like and also the fastener openings in the bottom wall of the base for facilitating securement of the rack to the surface. The rack further includes optional bracing so that the rack is strengthened for use in areas prone to seismic occurrences.

23 Claims, 5 Drawing Sheets

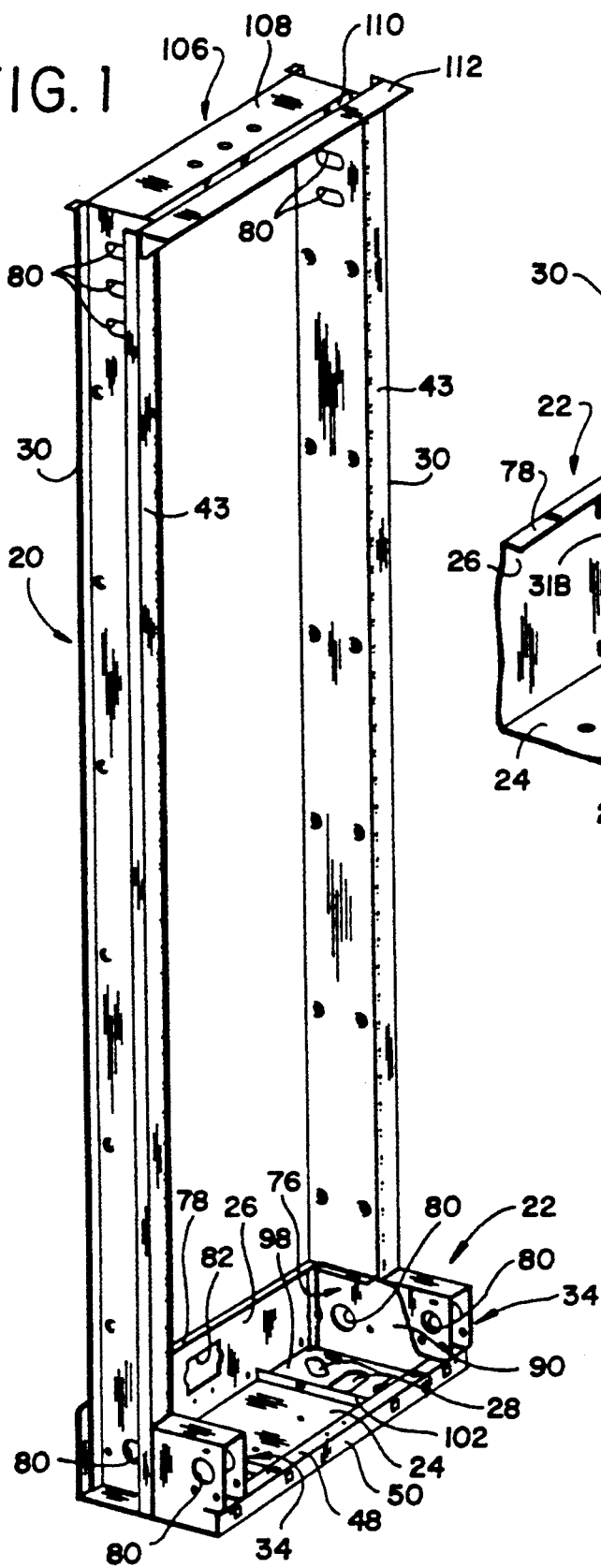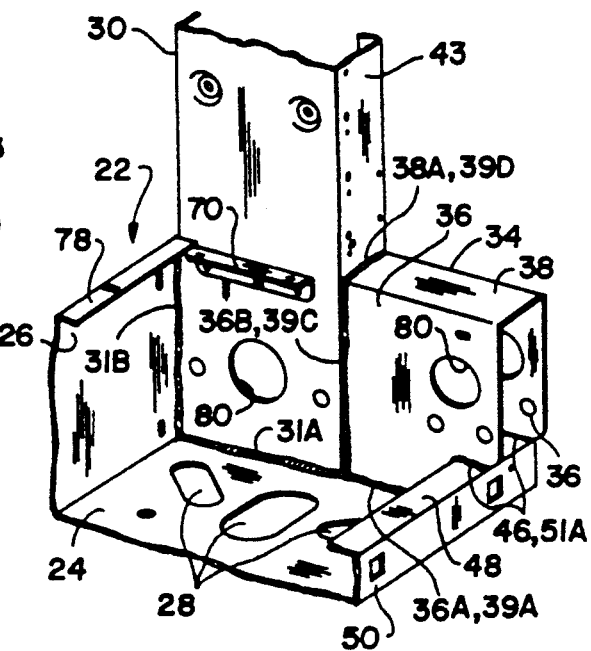

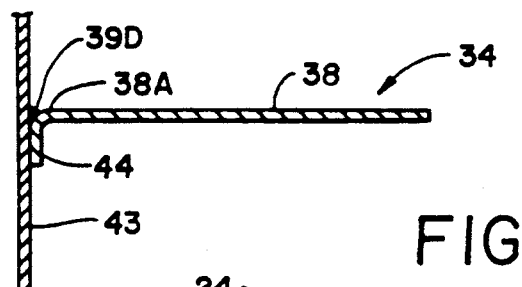
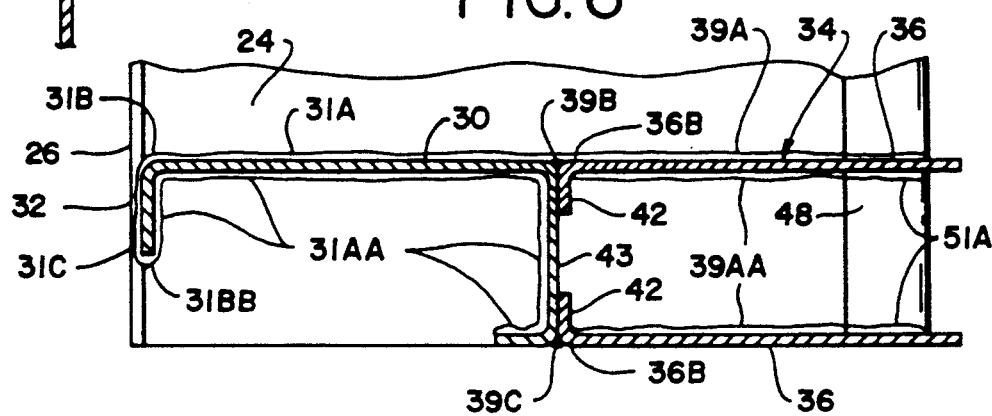
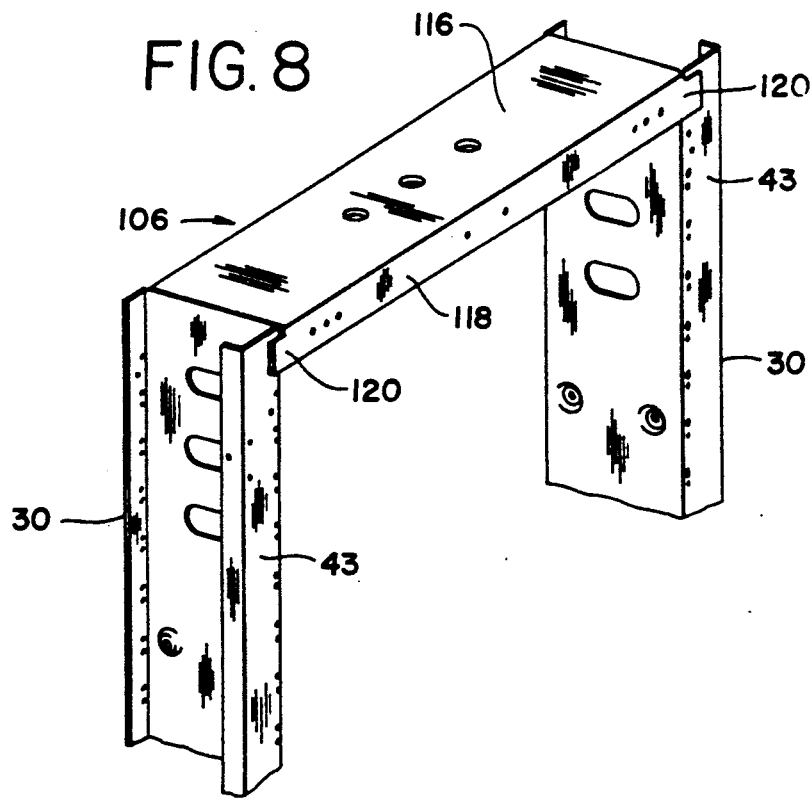

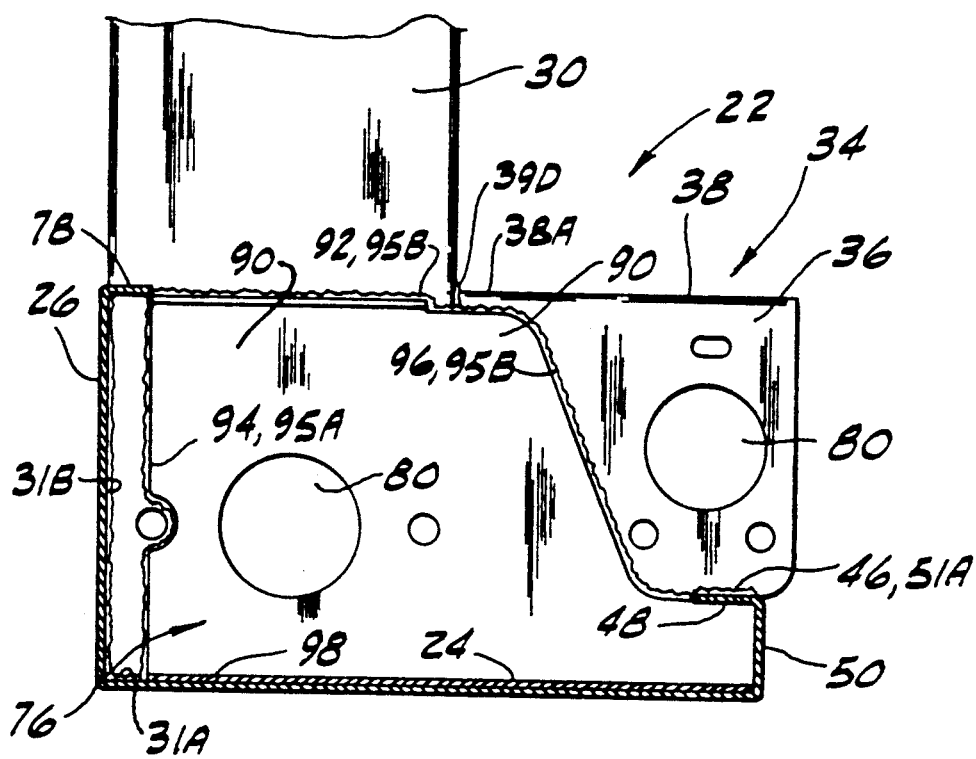

5,284,254

RACK FOR ELECTRICAL EQUIPMENT

BACKGROUND OF THE INVENTION

This invention relates generally to racks and, more particularly, to a rack for electrical equipment.

The present invention represents an improvement on the rack described in U.S. Pat. No. 5,004,107. The rack shown in that patent has a horizontal extension (identified by the reference numeral 33 in the patent drawings) overhanging the bottom of the base of the rack. The extension is not removable from the rack and thus hinders installation of, and access to, wiring and electrical equipment located in the space below the extension. The extension also makes it difficult to secure the rack to the floor, which is usually accomplished by drilling holes into the floor and then driving bolts into these holes through openings in the bottom of the base. The presence of the immovable extension typically requires that the floor be marked (using the openings in the base as a template) to show the drill locations, the rack moved, the holes drilled, the rack returned to its original position, and the bolts then driven into the drill holes through the openings in the base. This process is time-consuming and inconvenient, and the extension still tends to inhibit driving of the bolts into place.

The construction and assembly of the seismically braced rack shown in U.S. Pat. No. 5,004,107 is substantially different from racks used in areas where bracing to resist earthquake damage is not necessary. Therefore, substantially different components and procedures must be set up to manufacture racks with and without seismic reinforcement. Also, the gusset design shown in U.S. Pat. No. 5,004,107 is not suited for retrofit application to existing racks to make them more earthquake resistant.

SUMMARY OF THE INVENTION

Among the several objects of this invention may be noted the provision of an improved rack of the aforementioned type; the provision of such a rack which has a removable cover to facilitate access to the space above the bottom of the base; the provision of such a rack which is easy to secure to a floor; the provision of such a rack which may incorporate an optional brace design to make the rack sufficiently strong and stable to meet earthquake resistance standards; the provision of such a brace design which is adapted for retrofit on existing racks; and the provision of such a rack which can be manufactured with seismic reinforcement without substantial changes to the construction and assembly of the rack.

Generally, a rack for electrical equipment constructed according to the principles of the present invention comprises a base having a front, a back and opposite sides, a bottom wall, and a back wall extending up from the bottom wall at the back of the rack. The bottom wall has a plurality of fastener openings therein through which fasteners may be driven into a surface supporting the rack for securing the rack to the surface. A pair of legs extend up from the bottom wall of the base at opposite sides of the base adjacent the back wall of the base. A cover, which is adapted to be removably fastened to the base of the rack in a position where the cover extends forward from the back wall of the base between the legs of the rack, is spaced above the bottom wall of the base to form, in combination with the back and bottom walls of the base, an enclosure for electrical wiring and the like. Fasteners for removably fastening the cover in fixed position on the base are adapted to be unfastened for removing the cover from the base thereby to provide ready access to the electrical wiring and the like and also to the fastener openings in the bottom wall of the base thereby to facilitate securement of the rack to the surface.

Other objects and features will be in part apparent and in part pointed out hereinafter.

BRIEF DESCRIPTION OF THE DRAWINGS

FIG. 1 is a perspective of a rack of the present invention;

FIG. 5 is a vertical section taken in the plane including line 5—5 of FIG. 2;

FIG. 6 is a horizontal section taken in the plane including line 6—6 of FIG. 2;

FIG. 7 is a fragmentary perspective of a lower portion of the rack of FIG. 2 further including cover supports;

FIG. 8 is a fragmentary perspective of an upper portion of a rack of a second embodiment; and FIG. 9 is a vertical section taken in the plane including line 9—9 of FIG. 3.

Corresponding reference characters indicate corresponding parts throughout the several views of the drawings.

DETAILED DESCRIPTION OF THE PREFERRED EMBODIMENTS

Figure 2:
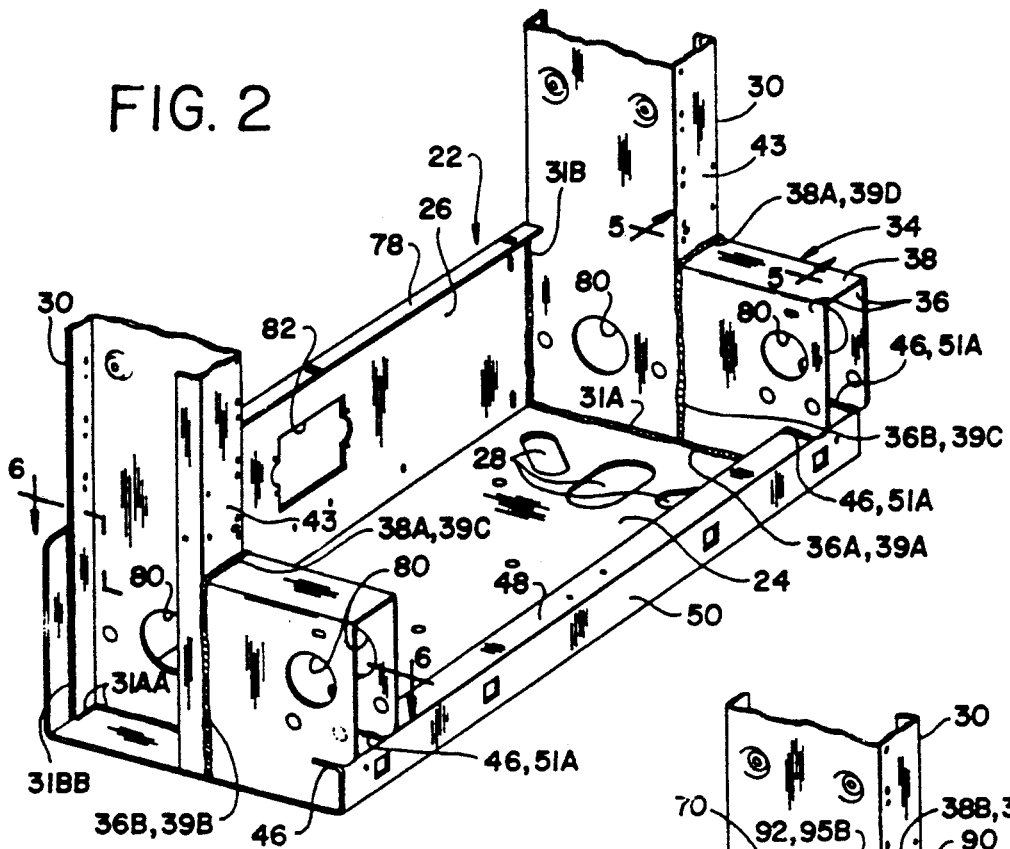
FIG. 2 is an enlarged perspective of the lower portion of a rack substantially the same as the rack of FIG. 1, but without seismic bracing.

Referring now to FIGS. 1 and 7 of the drawings, a rack of the present invention is indicated generally at 20. The rack 20, which is particularly adapted for mounting electrical equipment (e.g., telephone relay circuits), includes a base, generally indicated at 22, having a front, a back, opposite sides, a bottom wall 24 and a back wall 26 extending up from the bottom wall generally at the back of the base. A plurality of fastener openings 28 in the bottom wall 24 may have fasteners (not shown) driven through them and into a surface (not shown) supporting the rack 20 for securing the rack to the surface. The fastener openings 28 are elongated, which permits flexibility in the positioning of the fasteners along the length of the openings. A pair of channel-shaped legs 30 extend up from the bottom wall 24 of the base at opposite sides of the rack adjacent the back wall 26 of the base 22. The legs 30 are affixed to the bottom wall 24 of the base by welding along weld lines 31A on the laterally inward sides of the legs and along weld lines 31AA on the laterally outward sides of the legs (FIG. 6). The legs 30 are attached to the back wall 26 of the base by welds along lines 31B and 31BB extending up the back wall at laterally inner and outer sides of the legs, respectively. Other welds connecting the legs 30 and back wall 26 extend along lines 31C across rearwardly facing flanges 32 of the legs.

A pair of support members, each indicated generally at 34, of inverted channel shape are at opposite sides of the base 22 and extend forward above the bottom wall 24 from respective legs 30 of the rack to the front of the base. Each support member 34 has a pair of generally parallel, spaced-apart side walls 36 extending up from the bottom wall 24 of the base 22 and lying in planes extending in front-to-back direction with respect to the base, and a top wall 38 connecting the side walls. The side walls 36 have lower edges 36A contiguous with the bottom wall 24 of the base and upwardly extending rear edge margins 36B contiguous with a respective leg 30 of the rack. The top wall 38 of each support member 34 has a rear edge margin 38A contiguous with a respective leg 30 of the rack. As best seen in FIGS. 2 and 6, the laterally inner lower edge 36A of the laterally inner sidewall of each support member 34 has a weld connection 39A with the bottom wall 24 of the base extending from a location adjacent a respective leg 30 of the rack and running continuously forward to a point adjacent the front of the base 22. The weld connection 39A to the bottom wall 24 along the lower edges 36A of the laterally inner sidewall 36 of each support member 34 provides additional strength to the rack 20. The lower edges 36A of both the laterally inner and outer side walls 36 are also welded to the bottom wall 24 along lines 39AA inside the support member 34 as shown in FIG. 6. The upwardly extending rear edge margins 36B of the side walls 36 of each support member have weld connections with a respective leg 30, which weld connections are coextensive with the rear edge margins. The weld connection affixing the laterally outer rear edge margin 36B of each support member 34 to the leg 30 is designated 39B, and the weld connection affixing the laterally inner rear edge margin 36B to the leg is designated 39C. The rear edge margin 38A of the top wall 38 of each support member also has a weld connection 39D with a respective leg 30 along the entire length of the top rear edge margin. Thus, there is a substantially continuous weld line connecting each support member 34 to the corresponding leg 30, which weld line includes: (1) weld connection 39B extending upwardly from the intersection of the laterally outer rear edge margin 36B with the bottom wall 24 to the top rear edge margin 38A; (2) weld connection 39D extending across the top rear edge margin to the laterally inner rear edge margin 36B; and (3) weld connection 39C extending down to the intersection of the laterally inner rear edge margin with the bottom wall.

Referring now to FIGS. 5 and 6, each support member 34 has been constructed so that a strong weld connection with a respective leg 30 may be achieved. The side walls 36 of each support member 34 are bent along their upwardly extending edge margins 36B to have inwardly-directed portions or lips 42 which extend generally parallel to an opposing surface (i.e., a forwardly facing flange 43) of the adjacent leg 30 (FIG. 6). Similarly, the top wall 38 of each support member is bent along its edge margin 38A to have a downwardly-directed portion or lip 44 contiguous with the leg 30 (FIG. 5). The lip 44 also extends generally parallel to the forwardly facing flange 43 of the leg 30. The lips 42, 44 on the side walls 36 and top wall 38 of the support members expose a greater surface area on both the support member 34 and the forwardly facing flange 43 to be welded together. Thus, there is a stronger connection between the support member 34 and corresponding leg 30 than with an ordinary butt weld between walls intersecting at right angles.

Forwardly opening slots 46 in the side walls 36 of each support member 34 receive a flange 48 extending rearwardly from an upper edge of a front flange 50 of the base 22. The front flange 50 is formed by bending the bottom wall 24 so that the front flange extends up from the bottom wall at the front of the base 22. The flange 48 is formed by bending an upper edge margin of the front flange 50 rearwardly. The engagement of the rearwardly extending flange 50 in the slots 46 strengthens the rack 20. In addition, the support member 34 is connected to the flange 48 by welds along weld lines 51A extending along the top edges of the slots 46. The weld lines 39A and 39AA connecting the lower edges 36A of the support member 34 to the bottom wall 22 terminate at the rearward edge of the flange 48 and do not extend under the flange.

Figure 4:
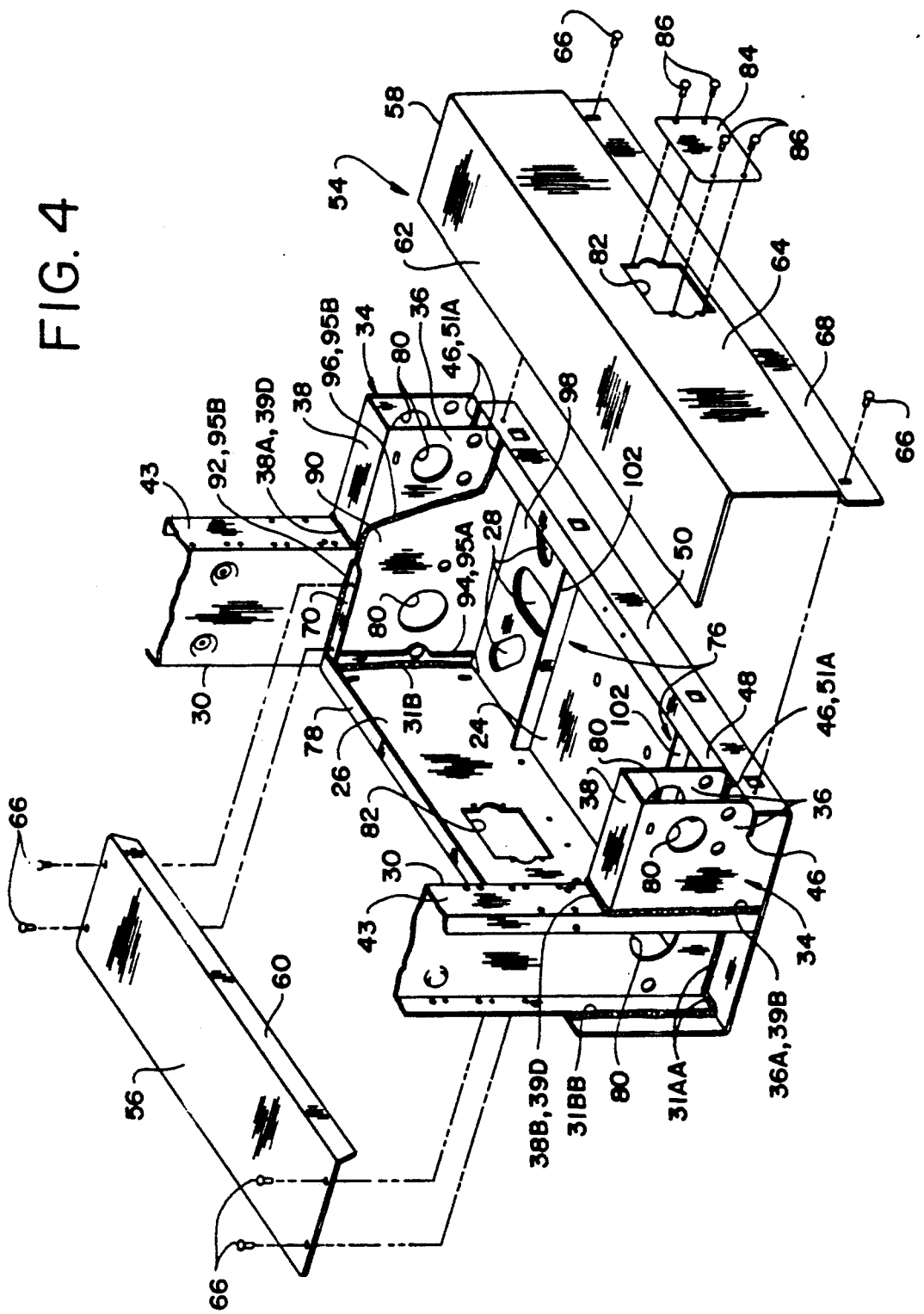
FIG. 4 is a perspective of the lower portion of the rack of FIG. 1 and a cover for the rack shown in exploded relation to the rack.

As shown in FIG. 4, a cover indicated generally at 54 is adapted to be removably fastened to the base 22 of the rack 20 in a position where the cover extends forward from the back wall 26 of the base between the legs 30 of the rack and is spaced above the bottom wall 24 of the base to form, in combination with the back and bottom walls of the base, an enclosure for electrical wiring and the like. The cover 54 includes a back cover part 56 extending forward from the back wall 26 of the base a distance less than the full front-to-back dimension of the base 22, and a front cover part 58 extending forward from adjacent the back cover part to the front of the base. The base cover part 56 has a downwardly turned flange 60 along its front edge margin to strengthen the back cover part. The front cover part 58 includes a top panel 62 adapted to overlie the base 22 and a front panel 64 depending from the top panel.

Fasteners 66 are provided for removably fastening the cover 53 in fixed position on the base 22. The back cover part 56 is fastened to the base 22 separately from the front cover part 58 so that each part may be attached to and removed from the base 22 independently of the other. The front cover part 58 is an optional piece of the cover 54, and the two-piece design of the cover permits the rack 20 to be selectively assembled in configurations with or without the front cover part. Even after assembly of the cover 54 with the rack 20, the fasteners 66 may be unfastened so that one or both cover parts may be removed for ready access to the electrical wiring in the base 22, and to the fastener openings 28 in the bottom wall 24.

Easy removal of the cover 54 for access to the fastener openings 28 greatly simplifies the securement of the rack 20 to the surface supporting the rack. The rack 20 may be set in the desired position on the surface and immediately secured by fasteners driven through the fastener openings 28 and into the surface. In many situations, there may be one hundred or more racks to be secured on a floor in a building. The advantage of a rack 20 which may be put in place on the floor and immediately secured thereto, over a rack (not shown) which must be put in place to locate the bores for the fasteners, moved out of the way to drill the bores and then replaced over the bores and secured with the fasteners, will be readily apparent.

The front panel 64 of the front cover part 58 has a lower edge margin 68 with openings in it adapted to be aligned with openings in the front flange 50 of the base 22. One fastener 66 may be inserted through each pair of the aligned openings to fasten the front cover part 58 to the base. A pair of cover supports 70 projecting toward one another from opposite legs 30 of the rack have fastener openings therein. The back cover part 56 has corresponding openings at its opposing ends adapted to be aligned with the openings in the cover supports 70 so that fasteners 66 may be inserted through the aligned openings to removably fasten the back cover part to the base 22.

Figure 3:
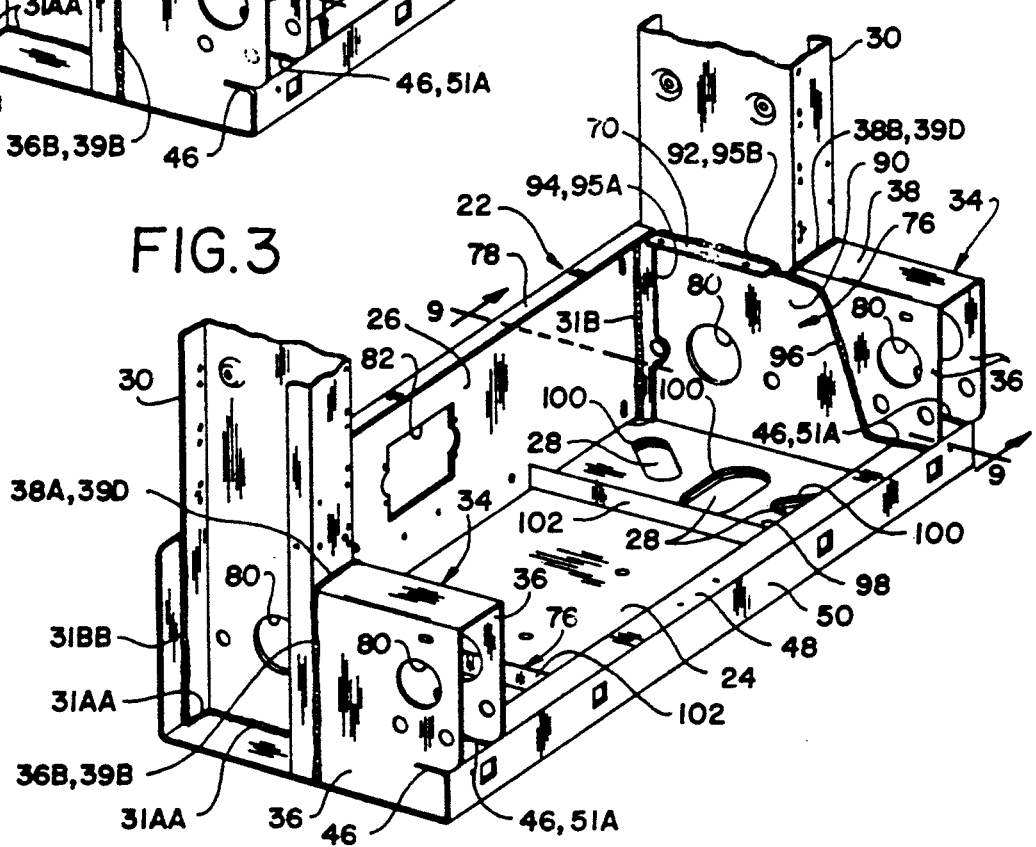
FIG. 3 is an enlarged perspective of the lower portion of the rack of FIG. 1.

As shown in FIG. 7, each cover support 70 is connected (as by fasteners) to a respective leg 30 when the rack 20 is not reinforced by seismic occurrences. However, when the rack 20 is reinforced by braces, each generally indicated at 76, the cover supports 70 may be integrally formed with the braces (FIG. 3). The seismic brace 76 will be described in greater detail hereinafter. In addition to the cover supports 70, the back wall 26 of the base has an upper edge which is bent to extend generally horizontally forward to form a cover-supporting lip 78 which is generally co-planar with the cover supports. In the illustrated embodiments, the back cover part 56 rests on the lip 78, but is not fastened thereto.

As shown in FIG. 2, there are openings 80 in the legs 30 and support members 34 for receiving conduits which carry, for instance, high-voltage (e.g., 110 volt) electrical wiring into the base 22 of the rack 20. Any fastener openings 28 in the bottom wall 24 which are not used to secure the rack 20 to the support surface may also receive electrical conduits. One or more of the openings 28 on each side of the base 22 will be used to secure the rack 20 to the support surface as required for the particular application. The back wall 26 and the front panel 64 of the cover have generally rectangular openings 82 in which electrical boxes and the like (not shown) can be mounted. Cover plates, such as the cover plate 84 shown in FIG. 4, are provided for closing an unused rectangular opening 82 in the front panel 64 and/or back wall 26. A cover plate 84 may be removably attached by fasteners 86 to the front panel 64 over the rectangular opening 86 or to the back wall 26 over the rectangular opening 82. Installation of wiring in the rack 20 and in an electrical box (not shown) attached to the rack in one of the openings 82 is greatly facilitated because the cover 54 may be removed as described above.

To reinforce the rack 20, the braces 76, which are completely separate from the support members 34, are attached to the base 22 adjacent opposite legs 30 of the rack. As shown in FIG. 3, each brace has a generally vertical leg 90 which extends forward from generally adjacent the back wall 26 of the base, the rearward edge 94 of the leg being spaced a small distance forward from the back wall 26. A top portion of the vertical leg 90 is bent to extend laterally inwardly from a top edge 92 of the leg to form one of the aforementioned cover supports 70.

As shown in FIG. 9, each brace 76 is arranged so that its vertical leg 90 bridges a respective leg 30 and associated support member 34 of the rack 20. The vertical leg 90 is attached, as by welding, to a respective leg 30 and side wall 36 of the associated support member 34. A weld line 95A extends continuously from adjacent the bottom wall 24 of the base 22 up the rearward edge 94 of the leg 90 to its top edge 92. A weld line 95B continues forwardly the length of the top edge 92 and along a generally downwardly sloping forward edge 96 (the top edge 92 and forward edge 96 combining to constitute "an upper edge" of the brace 76). The portion of the weld line 95B along the forward edge 96 of the vertical leg 90 terminates at its intersection with the weld 51A of the support member 34 to the flange 48 in slot 46. At the point of intersection of the welds 95B and 51A, the forward edge 96 has curved so that it no longer slopes downwardly but rather extends substantially horizontally parallel to the bottom wall 24 of the base 22. The vertical leg 90 of brace 76 extends under the flange 48, and, although there is no weld under the flange 48, the engagement of the brace with the flange provides additional mechanical strength to resist movement during an earthquake.

Each brace 76 also includes a generally horizontal leg 98 extending laterally from a lower edge of the vertical leg and overlies the bottom wall 24 of the base 22. Neither the vertical leg 90 nor the horizontal leg 98 have a weld connection to the bottom wall 24, but openings 100 are provided in the horizontal leg which are aligned with a corresponding fastener opening 28 in the bottom wall of the base so that fasteners can be driven through the aligned openings 28, 100 and into the surface supporting the rack 20 for securing the rack to the surface. The end of the horizontal leg 98 opposite the lower edge of the vertical leg 90 has an upwardly turned flange 102 to provide additional strength for the horizontal leg. The flange 102 extends from adjacent the back wall 24 of the base less than the full length of the leg 98 in that direction, terminating generally at the rearward edge of the flange 48.

The removable cover 54 allows a rack 20 of the type shown in FIGS. 2 and 7 to be retrofitted with seismic braces 76 as shown in FIGS. 1, 3 and 4. Removal of the cover 54 gives a workman sufficient working space in the base 22 to position the braces 76 and make the welds necessary to securely fix the braces to the base in the manner previously described.

To further stabilize the legs 30 of the rack 20, support structure indicated generally at 106 extends between the legs at their upper edges and interconnects the legs. In the embodiment of the rack 20 shown in FIG. 1, the support structure 106 includes a channel-shaped strut 108 having a width less than the width of the legs 30. A laterally outwardly projecting tab (not shown) at each end of a rearwardly facing flange of the strut overlies a rearwardly facing portion of a respective leg 30 and is attached thereto, as by welding. There are no tabs on a forwardly facing flange 110 of the strut. However, the strut 108 is welded at its ends to respective legs 30 substantially along the entire length of the engagement of the ends of the strut with the legs. The support structure 106 further includes an angle 112 extending between the forwardly facing front flanges 43 of the legs 30 and connected at each end (e.g., by welding) to a front flange of a respective leg.

A second embodiment of the support structure 106 (shown in FIG. 8) includes a channel-shaped strut 116 having a width substantially the same as the width of the legs 30. The forwardly facing flange 118 of the strut 116 has tabs 120 similar to the tabs (not shown) on the rear flange of strut 108 of the FIG. 1 embodiment. The tabs 120 extend over a portion of the forwardly facing front flanges 43 of the legs 30 and are attached such as by welding to the legs. The rearwardly facing flange (not shown) of the strut 116 has no tabs. However, the strut 116 is welded at each end to the corresponding leg 30 everywhere the strut engages the leg.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. A rack for electrical equipment, comprising
a base having a front, a back and opposite sides, a bottom wall, and a back wall extending up from the bottom wall at the back of the rack, said bottom wall having a plurality of fastener openings therein through which fasteners may be driven into a surface supporting the rack for securing the rack to the surface,
a pair of legs extending up from the bottom wall of the base at opposite sides of the base adjacent the back wall of the base,
a cover adapted to be removably fastened to the base of the rack in a position where the cover extends forward from the back wall of the base between the legs of the rack and is spaced above the bottom wall of the base to form, in combination with the back and bottom walls of the base, an enclosure for electrical wiring and the like, and
fasteners for removably fastening the cover in fixed position on the base, said fasteners being adapted to be unfastened for removing the cover from the base thereby to provide ready access to said electrical wiring and the like and also to said fastener openings in the bottom wall of the base thereby to facilitate securement of the rack to said surface;
said cover comprising a back cover part extending forward from the back wall of the base a distance less than the full front-to-back dimension of the base, and a front cover part extending forward from adjacent the back cover part to the front of the base, said back cover part being separately fastened to the base so that it may be unfastened and nondestructively removed from the base without removing the front cover part.

2. A rack as set forth in claim 1 wherein said front cover part comprises a top panel adapted to overlie the base and a front panel depending from the top panel, said front panel having openings in it for receiving fasteners therethrough to removably fasten it to the base.

3. A rack as set forth in claim 2 wherein the bottom wall of the base is bent to form a front flange extending up from the bottom wall at the front of the base, the front panel of the front cover part having a lower edge margin with openings in it adapted to align with openings in said flange whereby fasteners may be inserted through the aligned openings to fasten the front cover part to the base.

4. A rack as set forth in claim 1 further comprising a pair of braces on the base adjacent opposite legs of the rack, said back cover part having fastener openings therein adapted to align with openings in said braces whereby fasteners may be inserted through the aligned openings to fasten the back cover part to the base.

5. A rack as set forth in claim 4 wherein each brace has a generally vertical leg welded to a respective leg of the rack, and a generally horizontal leg overlying the bottom wall of the base, said horizontal leg of the rack having no weld connections with the bottom wall of the base but having at least one fastener opening therein in register with one of said fastener openings in the bottom wall of the base, a fastener being adapted to be inserted through said registered openings and driven into said surface therebelow for securing the rack to the surface.

6. A rack as set forth in claim 1 further comprising a pair of cover supports projecting toward one another from opposite legs of the rack and having fastener openings therein adapted to align with fastener openings in said back cover part, and fasteners for insertion through said aligned openings for removably fastening the cover to the base.

7. A rack as set forth in claim 6 wherein the back wall of the base has an upper edge bent to extend generally horizontally forward to form a cover-supporting lip generally co-planar with said cover supports.

8. A rack as set forth in claim 1 wherein the back wall of the base and the front cover part have openings therein in which electrical boxes and the like can be mounted.

9. A rack for electrical equipment, comprising
a base having a front, a back and opposite sides, a bottom wall, and a back wall extending up from the bottom wall at the back of the rack, said bottom wall having a plurality of fastener openings therein through which fasteners may be driven into a surface supporting the rack for securing the rack to the surface, a pair of legs extending up from the bottom wall of the base at opposite sides of the base adjacent the back wall of the base,
a cover adapted to be removably fastened to the base of the rack in a position where the cover extends forward from the back wall of the base between the legs of the rack and is spaced above the bottom wall of the base to form, in combination with the back and bottom walls of the base, an enclosure for electrical wiring and the like,
fasteners for removably fastening the cover in fixed position on the base, said fasteners being adapted to be unfastened for removing the cover from the base thereby to provide ready access to said electrical wiring and the like and also to said fastener openings in the bottom wall of the base thereby to facilitate securement of the rack to said surface, and
a pair of support members at opposite sides of the base extending forward above the bottom wall of the base from respective legs of the rack to the front of the base, each support member being formed as an inverted channel to have a pair of generally parallel sides walls extending up from the bottom wall of the base and lying in planes extending in front-to-back direction with respect to the base, and a top wall connecting the side walls of the support member, and
a pair of braces associated with the support members, each brace being formed as a single piece separate from its respective support member to have a generally vertical leg extending forward from generally adjacent the back wall of the base to generally adjacent the front of the base, the arrangement being such that the vertical leg bridges a respective leg of the rack and the support member associated therewith, and a generally horizontal leg extending laterally from a lower edge of the vertical leg and overlying the bottom wall of the base, said vertical leg having a weld connection to a respective leg of the rack and a weld connection to a side wall of a respective support member, said horizontal leg of the brace having no weld connections with the bottom wall of the base.

10. A rack as set forth in claim 9 wherein the side walls of each support member have lower edges contiguous with the bottom wall of the base and upwardly extending edge margins contiguous with a respective leg of the rack, and wherein the top wall of each support member has an edge margin contiguous with a respective leg of the rack, said lower edges of each support member having weld connections with the bottom of the base from a location adjacent a respective leg of the rack forward to a point adjacent the front of the base, said upwardly extending edge margins of the side walls of each support member having weld connections with a respective leg of the rack, and said edge margin of the top wall of each support member having a weld connection with a respective leg of the rack.

11. A rack as set forth in claim 10 wherein said upwardly extending edge margins of the side walls of each support member are bent to extend generally parallel to an opposing surface of the leg, thereby providing a greater weld area between the edge margins and the opposing surface of the leg.

12. A rack as set forth in claim 10 wherein said edge margin of the top wall of each support member is bent to extend generally parallel to an opposing surface of the leg, thereby providing a greater weld area between the edge margin and the opposing surface of the leg.

13. A rack as set forth in claim 9 wherein the vertical legs of the braces have upper edge margins bent toward one another to provide a pair of generally horizontal cover supports, said cover supports having fastener openings therein adapted to align with fastener openings in said cover, and fasteners for insertion through said aligned openings for removably fastening the cover to the base.

14. A rack as set forth in claim 13 wherein the back wall of the base has an upper edge bent to extend generally horizontally forward to form a cover-supporting lip generally co-planar with said cover supports.

15. A rack as set forth in claim 9 wherein the vertical leg of each brace has a rearward edge spaced forward from the back wall of the base, and an upper edge bridging a respective leg of the rack and a side wall of its respective support member, said rearward edge of the brace having a weld connection to a respective leg of the rack, and said upper edge of the brace having a weld connection to a respective leg of the rack and to a side wall of a respective support member.

16. A rack for electrical equipment, comprising
a base having a front, a back and opposite sides, a bottom wall, and a back wall extending up from the bottom wall at the back of the rack,
a pair of legs extending up from the bottom wall of the base at opposite sides of the base adjacent the back wall of the base,
a pair of support members at opposite sides of the base extending forward above the bottom wall of the base from respective legs of the rack to the front of the base, each support member being formed as an inverted channel to have a pair of generally parallel sides walls extending up from the bottom wall of the base and lying in planes extending in front-to-back direction with respect to the base, and a top wall connecting the side walls of the support member, and
a pair of braces associated with the support members, each brace being formed as a single piece separate from its respective support member to have a generally vertical leg extending forward from generally adjacent the back wall of the base to generally adjacent the front of the base, the arrangement being such that the vertical leg bridges a respective leg of the rack and the support member associated therewith, and a generally horizontal leg extending laterally outwardly from a lower edge of the vertical leg and overlying the bottom wall of the base, said vertical leg having a weld connection to a respective leg of the rack and a weld connection to a side wall of a respective support member, and said horizontal leg of the brace having no weld connections with the bottom wall of the base.

17. A rack as set forth in claim 16 wherein the side walls of each support member have lower edges contiguous with the bottom wall of the base and upwardly extending edge margins contiguous with a respective leg of the rack, and wherein the top wall of each support member has an edge margin contiguous with a respective leg of the rack, said lower edges of each support member having weld connections with the bottom of the base from a location adjacent a respective leg of the rack forward to a point adjacent the front of the base, said upwardly extending edge margins of the side walls of each support member having weld connections with a respective leg of the rack, and said edge margin of the top wall of each support member having a weld connection with a respective leg of the rack.

18. A rack as set forth in claim 17 wherein said upwardly extending edge margins of the side walls of each support member are bent to extend generally parallel to an opposing surface of the leg, thereby providing a greater weld area between the edge margins and the opposing surface of the leg.

19. A rack as set forth in claim 17 wherein said edge margin of the top wall of each support member is bent to extend generally parallel to an opposing surface of the leg, thereby providing a greater weld area between the edge margin and the opposing surface of the leg.

20. A rack as set forth in claim 17 wherein the vertical leg of each brace has a rearward edge spaced forward from the back wall of the base, and an upper edge bridging a respective leg of the rack and a side wall of its respective support member, said rearward edge of the brace having a weld connection to a respective leg of the rack, and said upper edge of the brace having a weld connection to a respective leg of the rack and to a side wall of a respective support member.

21. A rack for electrical equipment, comprising
a base having a front, a back and opposite sides, a bottom wall, and a back wall extending up from the bottom wall at the back of the rack, said bottom wall having a plurality of fastener openings therein through which fasteners may be driven into a surface supporting the rack for securing the rack to the surface,
a pair of legs extending up from the bottom wall of the base at opposite sides of the base adjacent the back wall of the base,
a cover adapted to be removably fastened to the base of the rack in a position where the cover extends forward from the back wall of the base between the legs of the rack and is spaced above the bottom wall of the base to form, in combination with the back and bottom walls of the base, an enclosure for electrical wiring and the like,
fasteners for removably fastening the cover in fixed position on the base, said fasteners being adapted to be unfastened for removing the cover from the base thereby to provide ready access to said electrical wiring and the like and also to said fastener openings in the bottom wall of the base thereby to facilitate securement of the rack to said surface, said cover comprising a back cover part extending forward from the back wall of the base, and a front cover part extending forward from adjacent the back cover part to the front of the base, said back cover part being separately fastened to the base so that it may be unfastened and nondestructively removed from the base without removing the front cover part.

22. A rack as set forth in claim 21 further comprising a pair of cover supports projecting toward one another from opposite legs of the rack and having fastener openings therein adapted to align with fastener openings in said back cover part, and fasteners for insertion through said aligned openings for removably fastening the cover to the base.

23. A rack as set forth in claim 22 wherein the back wall of the base has an upper edge bent to extend generally horizontally forward to form a cover-supporting lip generally co-planar with said cover supports.

* * * * *